United States Patent
Otake et al.

(10) Patent No.: US 7,062,630 B2
(45) Date of Patent: Jun. 13, 2006

(54) STORING DEVICE FOR WRITING DATA ONTO A PLURALITY OF INSTALLED STORING MEDIUMS, STORING CONTROL METHOD FOR THE STORING DEVICE, AND PROGRAM THEREOF

(75) Inventors: Toshihiko Otake, Nishinomiya (JP);
Tsutomu Sekibe, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 298 days.

(21) Appl. No.: 10/399,236

(22) PCT Filed: Oct. 26, 2001

(86) PCT No.: PCT/JP01/09459

§ 371 (c)(1),
(2), (4) Date: Apr. 14, 2003

(87) PCT Pub. No.: WO02/35548

PCT Pub. Date: May 2, 2002

(65) Prior Publication Data

US 2004/0030825 A1 Feb. 12, 2004

(30) Foreign Application Priority Data

Oct. 26, 2000 (JP) .............................. 2000-326472

(51) Int. Cl.
*G06F 12/00* (2006.01)
(52) U.S. Cl. ....................... 711/171; 711/103; 711/157; 711/5; 365/185.33

(58) Field of Classification Search ................ 711/103, 711/114, 157, 171
See application file for complete search history.

(56) References Cited

U.S. PATENT DOCUMENTS

| | | | |
|---|---|---|---|
| 5,212,794 A * | 5/1993 | Pettis et al. .................. | 717/153 |
| 5,572,466 A | 11/1996 | Sukegawa | |
| 5,603,001 A | 2/1997 | Sukegawa et al. | |
| 5,848,275 A * | 12/1998 | Maydan et al. .............. | 717/159 |
| 5,940,618 A * | 8/1999 | Blandy et al. ............... | 717/128 |
| 6,002,875 A * | 12/1999 | Stolberg ...................... | 717/153 |
| 6,625,806 B1 * | 9/2003 | Ono et al. .................... | 717/136 |
| 2004/0215880 A1 * | 10/2004 | Chilimbi et al. ............. | 711/118 |

FOREIGN PATENT DOCUMENTS

| | | |
|---|---|---|
| JP | 2000-122917 | 4/2000 |
| JP | 2000-132982 | 5/2000 |

\* cited by examiner

*Primary Examiner*—Donald Sparks
(74) *Attorney, Agent, or Firm*—McDermott Will & Emery LLP

(57) ABSTRACT

A storing device can reduce the frequency of the saving operation at a step of rewriting data on the storing mediums. Where q is a size of all the data to write in storing mediums, m is the number of the storing mediums, and p is each block size, a quotient expressed by $zm+w+y$ ($z: 0 \leq z$ (integer); $w: 0 \leq w < m$ (integer); $y: 0 \leq y < 1$) is calculated by dividing q by p. It is configured so that the data for $zm$ blocks is written in parallel on m storing mediums, and then the data for $q/p-zm$ blocks is written on $w+1$ storing mediums (w in the case of $y=0$).

14 Claims, 10 Drawing Sheets

(a) 4 BLOCK WRITING

| LOGISTIC ADDRESS | PARALLELISM | NUMBER OF NON-PARALLELISM SECTION | FLASH MEMORY DESIGNATION | PHYSICAL ADDRESS | SECTOR ROW MANAGEMENT INFORMATION |
|---|---|---|---|---|---|
| a | 4 | 0 | 0 | A | 0,0,0,.....,0 |
| a+1 | 4 | 0 | 1 | B | 1,1,1,.....,1 |
| a+2 | 4 | 0 | 2 | C | 2,2,2,.....,2 |
| a+3 | 4 | 0 | 3 | D | 3,3,3,.....,3 |

(b) 2 BLOCK WRITING

| LOGISTIC ADDRESS | PARALLELISM | NUMBER OF NON-PARALLELISM SECTION | FLASH MEMORY DESIGNATION | PHYSICAL ADDRESS | SECTOR ROW MANAGEMENT INFORMATION |
|---|---|---|---|---|---|
| b | 2 | 0 | 0 | E | 0,0,0,.....,0 |
| b+1 | 2 | 0 | 1 | F | 1,1,1,.....,1 |

(c) 1.5 BLOCK WRITING

| LOGISTIC ADDRESS | PARALLELISM | NUMBER OF NON-PARALLELISM SECTION | FLASH MEMORY DESIGNATION | PHYSICAL ADDRESS | SECTOR ROW MANAGEMENT INFORMATION |
|---|---|---|---|---|---|
| c | 2 | 16 | 0 | G | 0,0,0,.....,0 |
| c+1 | 2 | 16 | 1 | H | 1,1,1,.....,1 |

FIG. 4
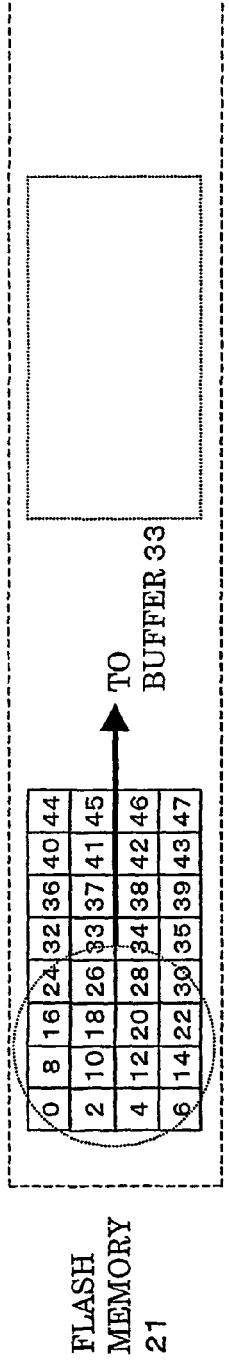
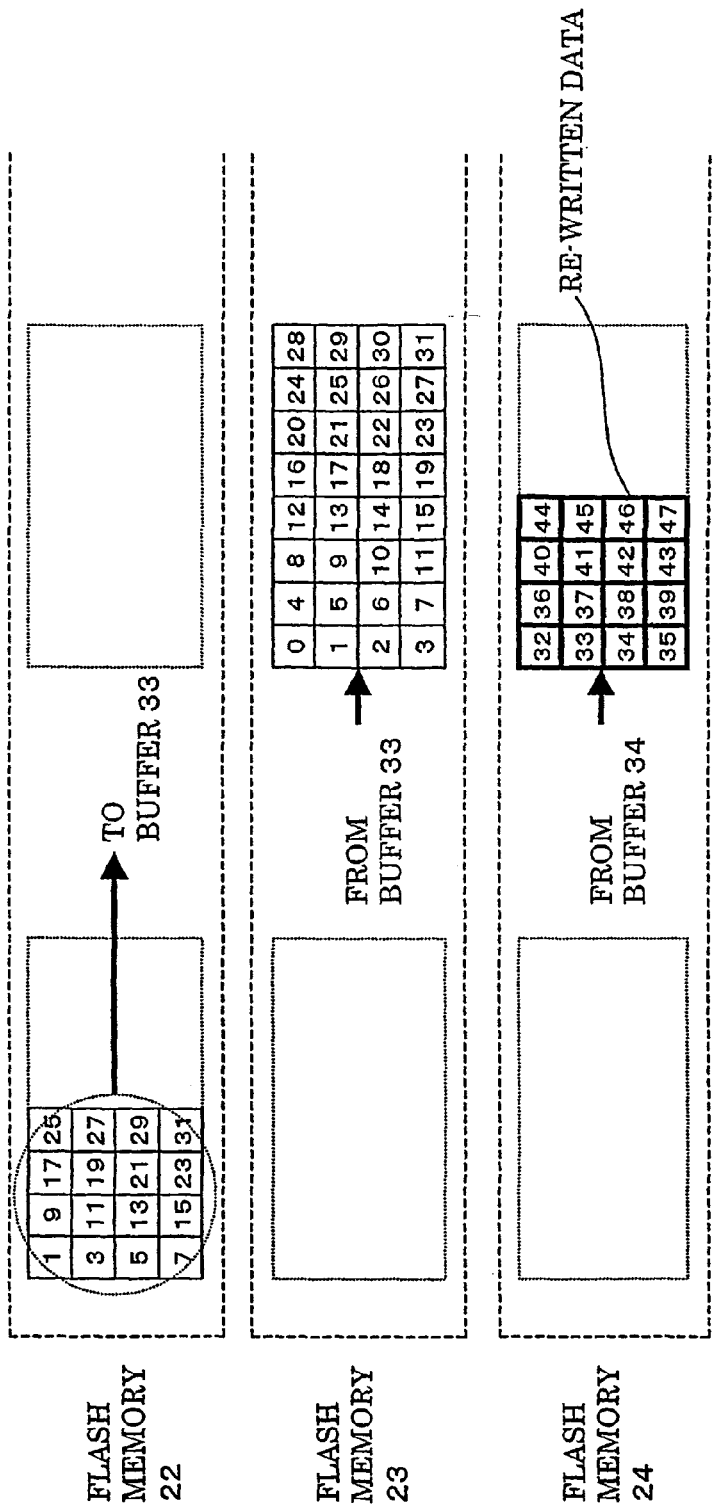

(a) AFTER 1.5 BLOCK WRITING

| LOGISTIC ADDRESS | PARALLELISM | NUMBER OF NON-PARALLELISM SECTION | FLASH MEMORY DESIGNATION | PHYSICAL ADDRESS | SECTOR ROW MANAGEMENT INFORMATION |
|---|---|---|---|---|---|
| c | 2 | 16 | 0 | G | 0,0,0,....,0 |
| c+1 | 2 | 16 | 1 | H | 1,1,1,....,1 |

(b) AFTER 0.5 BLOCK RE-WRITING

| LOGISTIC ADDRESS | PARALLELISM | NUMBER OF NON-PARALLELISM SECTION | FLASH MEMORY DESIGNATION | PHYSICAL ADDRESS | SECTOR ROW MANAGEMENT INFORMATION |
|---|---|---|---|---|---|
| c | 1 | 0 | 2 | I | 0,0,0,....,0 |
| c+1 | 1 | 0 | 3 | J | 0,0,0,....,0 |

STORING DEVICE FOR WRITING DATA ONTO A PLURALITY OF INSTALLED STORING MEDIUMS, STORING CONTROL METHOD FOR THE STORING DEVICE, AND PROGRAM THEREOF

FIELD OF THE INVENTION

The present invention relates to a storing device for storing data. More specifically, this invention relates to a storing device for storing data on storing mediums like a flash memory.

THE PRIOR ART

Storing devices for portable devices handling music data or video data generally use storing mediums like a flash memory, because the flash memory has features that 1) data therein is rewritable, 2) a high portability, and 3) no backup power like the battery.

The conventional flash memory, however, has a problem that a waiting time is needed when data is written. Specifically, in comparison with the time for transferring a target data to a buffer in the storing device, the writing of the data from the buffer to the flash memory takes extremely long time.

The unexamined Japanese patent application No. 2000-132982 discloses a storing device provided with a plurality of flash memories. In such storing device, the data can be written into a plurality of flash memories in parallel, whereby the problem of the waiting time will not be generated.

Generally, the smallest unit to write data on the flash memory is a sector, and a group of data to be erased from the flash memory (the data erasing will be described later) is a block. That is, as shown in FIG. 9 (*a*), data within the flash memory is managed block by block, each block made up of 32 sectors (it is to be understood that the data length of the sector is 512 bytes, and the data length of the block is 16 kilobytes).

The flash memory has a feature that the writing of data is one-way only. In other words, the flash memory is configured so as to rewrite data from 0 to 1, but it is not possible to rewrite data from 1 to 0. Therefore, the flash memory needs to change all data to 1, before new data is written therein (Hereinafter, this changing is to be called "an erase operation." A region subjected to the erase operation is to be called the "erased region" while a region not subjected to the erase operation is to be called the "unerased region.") In case of rewriting data 0–15 within a block A shown in FIG. 9 (*b*), data 16–31 which do not have to be rewritten are first read out on a buffer B from a flash memory F1, as shown in FIG. 9 (*c*). After the data 16–31 thus read out on buffer B are written on an erased region E of another flash memory F2, the data of the block A is erased.

The series of steps (so as not to involve the data 16 to 31 in the rewriting steps, because those do not need to be rewritten) is called a saving operation, which is a major cause to reduce the speed of writing data in the flash memory. In FIG. 9(*d*), the data 0 to 15 has been rewritten to data that is given from outside to the storing device, but the steps of data transfer are not explained here.

The storing device disclosed in the unexamined Japanese patent application No. 2000-132982 is configured to write data on a plurality of flash memories in parallel, as mentioned above, with the result that there is not the problem of waiting time. However, the parallel writing of data on plural flash memories increases the occurrence of the saving operation for the erase operation.

That is, when certain music data M1 is to be written on the flash memories, unless the data size is an integral multiple of (a block size in the flash memory)×(the number of flash memories), the respective last blocks B1 to B4 of the flash memories F1 to F4 (which are explained later) have vacant regions as shown in FIG. 10. In addition, if other music data M2 are written on the flash memories F1 to F4, the music data M2 will be written from the vacant regions in the last blocks B1 to B4, and as a result, the different music data M1, M2 are in the same blocks. Therefore, if all the music data M1 are erased, the music data M2 written on the last blocks B1 to B4 should be saved.

The last block as mentioned above is the end block of the blocks to which target data is written. That is, in case of writing data in parallel to m flash memories, as shown in FIG. 6, hatching blocks on the left side of the alternate long and short dash line do not have vacant regions, but other hatching blocks on the right side of the alternate long and short dash line may have vacant regions. Those blocks with vacant regions are blocks to which the target data is written in conclusion, and they are called "last blocks".

SUMMARY OF THE INVENTION

The present invention is suggested in view of the above conventional problems, and has an object to reduce the occurrence of the saving operation for a storing device in which data can be written on a plurality of flash memories in parallel.

To achieve the object, the invention adopts the following means. That is, a storing device of the invention, as shown in FIG. 1, is provided with a plurality of storing mediums, 21 22, 23, and 24, each storing medium operable to write data per storing region as well as to erase data by blocks, and the storing device is configured to write data inputted from outside on the storing mediums in parallel.

Where q is a size of all the data to write in the flash memories, m is the number of the storing mediums, and p is each block size, an address management unit 42 first calculates a quotient by dividing q by p, which is expressed by zm+w+y (z: $0 \leq z$ (integer); w: $0 \leq w < m$ (integer); y: $0 \leq y < 1$). The Address management unit 42 then so controls the data transfer as to write data for zm blocks on m storing mediums by writing m blocks, 1 per medium, in parallel z times, and then to write data for q/p−zm blocks on w+1 storing mediums (w in the case of y=0).

For example, the address management unit 42 controls the data transfer as to write the data for q/p−zm blocks on w+1 storing mediums in parallel as shown in FIG. 8 (*a*). That reduces the number of blocks where vacant region is caused as compared with the prior art technique. Needless to say, that decreases the frequency of the saving operation.

Moreover, as shown in FIG. 8 (*b*), the writing of the data for q/p−zm blocks may be controlled so that each data for y block be written on w+1 storing mediums in parallel, and after that, each data for 1−y block be written on w storing mediums in parallel. The number of block having the vacant regions results in one at most. Therefore, the frequency of the saving operation will further decrease.

Furthermore, the data transfer may be so controlled to allocate the data for q/p−zm blocks to w+1 storing mediums and to write on the respective storing mediums in a specific order as shown in FIG. 8 (*c*). This control method is effective especially when there exist "data that do not need to be rewritten" on the block which contains storing regions to be rewritten. That is, in such a case, the address management unit 42 controls the data transfer by regarding the sum of the data not to be rewritten and the data to be written as data for q/p−zm blocks.

BRIEF DESCRIPTION OF THE DRAWINGS

FIG. 2 is an explanatory diagram of the first data writing control method.

FIG. 3 is a block control table at the time of the first data writing control.

FIG. 4 is an explanatory diagram of the second data writing control method.

DESCRIPTION OF THE PREFERRED EMBODIMENTS

Figure 1:
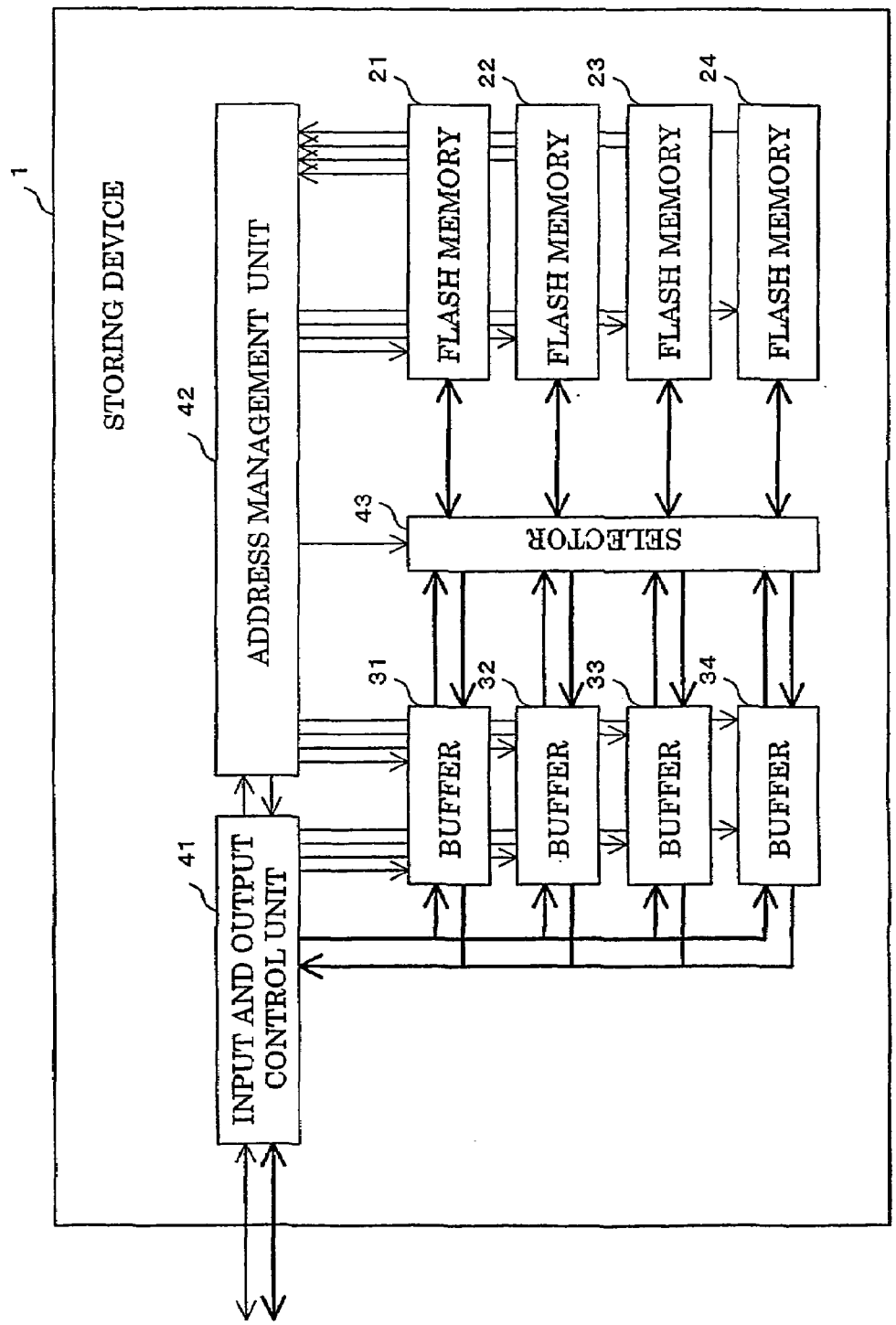
FIG. 1 is a block diagram of a storing device to which the present invention is applied.

FIG. 1 is a block diagram of a storing device to which the present invention is applied, and its configuration will be described. In the following description, it is presupposed that the data length of the sector is 512 bytes and the data length of the block is 16 kilobytes.

First, receiving a request for writing, reading, erasing data or the like from outside, an input and output control unit 41 issues instructions for starting the requested processing to address management unit 41 and controls the inputting and outputting of data as follows.

That is, on receiving a request for writing data, the input and output control unit 41 writes data inputted from outside on a plurality of buffers 31, 32, 33, and 34 in 512 bytes one after another. On the other hand, on receiving a request for reading out data, the input and output control unit 41 reads out data in 512 bytes from a plurality of buffers 31, 32, 33, and 34, and outputs the data 512 bytes to outside one after another.

In compliance with a processing starting instruction from the input and output control unit 41, an address management unit 42 controls the transfer of data between a plurality of flash memories 21, 22, 23, 24 and the plurality of buffers 31, 32, 33, 34, and controls the erasing of data on the plurality of flash memories 21, 22, 23, 24, and manages data written on the plurality of flash memories 21, 22, 23, 24 (which will be described in detail later).

Furthermore, according to a connection switchover signal from the address management unit 42, a selector 43 switches connection of data buses between the plurality of flash memories 21, 22, 23, 24 and the plurality of buffers 31, 32, 33, 34.

The control method of the data writing by the address management means 42 falls into following two steps. One is a control method for writing data onto logical address regions where no data have been written yet (hereinafter referred to as a "first data writing control method") and the other is for writing data onto logical address regions where data have already been written (hereinafter referred to as a "second data writing control method").

Now, those data writing control methods will be described in detail.

[First Data Writing Control Method]

First, on receiving a request to write data in the logical address regions where no data have been written, the data are written in 4 flash memories, 21, 22, 23, 24 in parallel, like the conventional way. The writing control of the present invention, however, has a difference that the writing to the respective last blocks of the flash memories 21, 22, 23, 24 depends on the size of data to be written therein, as shown in FIGS. 2 (*a*) to (*c*).

In case the size of data to be written is 64 kilobytes, for example, even if the data are written on 4 flash memories 21, 22, 23, 24 in parallel, any of the last blocks B21, B22, B23, B24 will not have vacant regions. That is because the data of 64 kilobytes corresponds to 4 blocks and is identical with the sum of the last blocks B21, B22, B23, B24.

Figure 2:
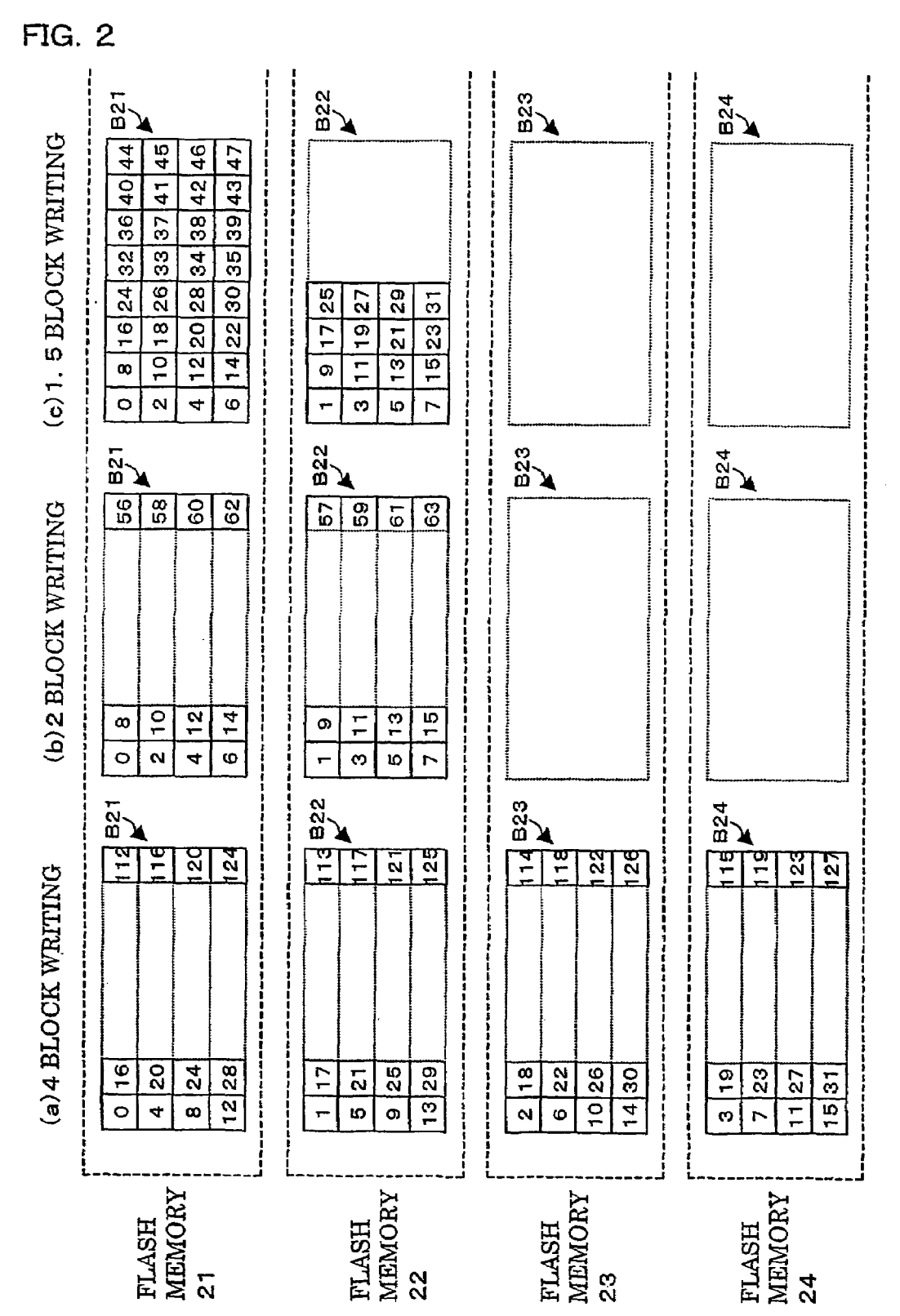

Therefore, the address management unit 42 in this case so controls the data transfer that data 0 to 127 will be written on the last blocks B21, B22, B23, B24 in parallel as shown in FIG. 2 (*a*) (hereinafter this mode of writing is to be called "4-block writing").

In case the size of data to be written is 32 kilobytes, if this data is written in 4 flash memories 21, 22, 23, 24 in parallel, each of the last blocks B21, B22, B23, B24 will have a ½ vacant region. That is because the data of 32 kilobytes corresponds to two blocks, which is equal to ½ of the sum of the last blocks B21, B22, B23, and B24.

Therefore, the address management unit 42 in this case so controls the data transfer that data 0 to 63 are written on only two last blocks B21, B22, in parallel. That is, to prevent blocks from having vacant regions, the address management unit 42 restrains the parallelism degree from 4 to 2 for writing on the last block B21, B22, B23, and B24 (hereinafter this mode of writing is called "two-block writing."

However limited the parallelism degree is as in the case of the 32 kilobytes data, if the size of the data to be written is 24 kilobytes, it will be impossible to prevent the last blocks from having vacant regions. That is because the 24-kilobyte data corresponds to 1.5 blocks, which is not equal to an integral multiple of the block.

Therefore, the address management unit 42 in this case so controls the data transfer so that the last block having the vacant regions is only one (see block 22 in FIG. 2(*c*)), and so that the data 0 to 47 are written in parallel as far as possible, as shown in FIG. 2 (*c*).

In other words, after the data 0 to 31 for one block are written on two last blocks B21, B22 in parallel, fractional data 32 to 47 for the remaining 0.5 block is written on the last block B21 only (hereinafter this mode of writing is to be called "1.5 block writing."). The expression "to write on one block only" used herein means to perform the parallel writing with a parallelism degree of 1.

As set forth above, the address management unit 42 is configured to select the control methods of the data writing depending on the size of data to be written. There will be described the selecting technique.

First, where q is the size of all the data to be written, m is the number of flash memories, and p is the block size, the size q of the all the data is divided by the block size p to obtain a quotient zm+w+y (z: $0 \leq z$ (integer); w: $0 \leq w$ (integer)<m; y $0 \leq y < 1$).

Figure 6:
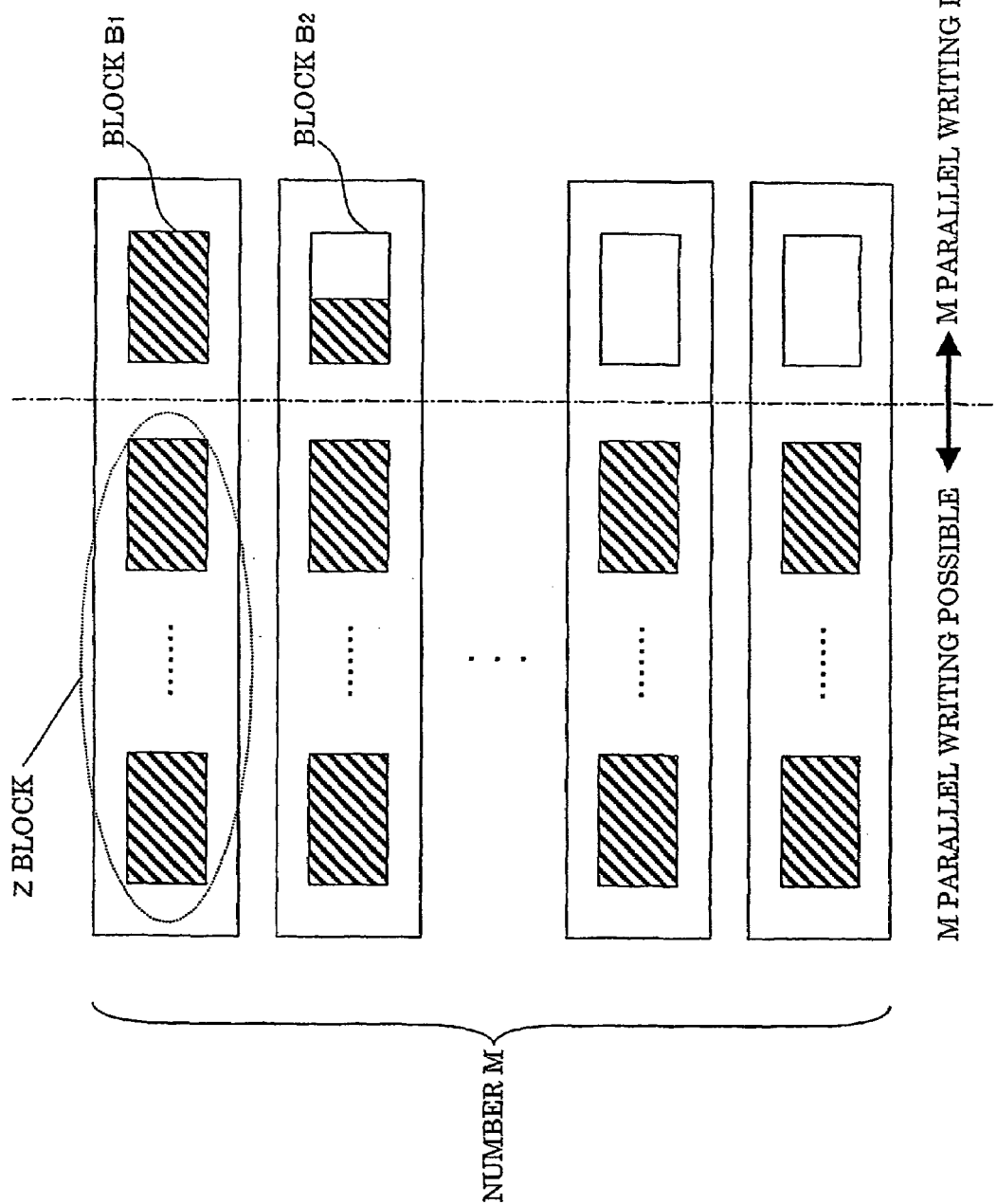
FIG. 6 is an explanatory diagram of a technique judging the data writing control method.

In the formula, zm is the number of blocks that is written with a parallelism degree of m, and w+y is the number of blocks where the parallelism degree does not reach m. That is, referring to FIG. 6, the number of the hatched blocks on the left side of alternate long and short dash line corresponds to zm, while the number of the hatched blocks on the right side of the alternate long and short dash line corresponds to w+y (w corresponds to block $B_1$, while y corresponds to the block $B_2$).

Therefore, the address management unit 42 controls the data transfer so that the data for zm blocks are written on m flash memories in parallel and after that, the data for q/p−zm blocks are written on w+1 of flash memories (in the case of y=0, the number of flash memories is w). But when the data for q/p−zm blocks are written, the each data for y block is written on w+1 flash memories in parallel, and after that, the each data for 1−y block is written on w flash memories in parallel.

The following is a concrete example of the control method. Where a block size is 16 kilobytes, the number of flash memories is 4, and the data size to be written is 152 kilobytes, the data transfer is configured so as to write 152 kilobytes of data onto 4 flash memories (p=16, m=4, q=152).

First, because q÷p=zm+w+y is 152÷16=2×4+1+0.5, it is found that z is 2; w is 1; and y is 0.5.

Therefore, data for a full block is written on each of 4 flash memories 2 times in parallel, and after that, the data for 1.5 blocks are written on 2 flash memories. But the writing of the data for 1.5 blocks is controlled so that each data for 0.5 block is written on 2 flash memories in parallel, and after that, the data for 1−0.5 block is written on one flash memory only. That is, referring to FIG. 6, each of the data for 0.5 block is written on block $B_1$ and block $B_2$ respectively, and after that, the data for 0.5 block is written on block $B_1$ only.

It has been described that the size q of all the data to be written is 152 kilobytes and the size p of block is 16 kilobytes. The unit of the size p and size q is not limited to byte. Even if, for example, the size q of all the data to be written is 304 sectors and the size p of the block is 32 sectors, the same results can be obtained.

According to the present invention, as set forth above, the number of blocks having vacant regions is at most one. In result, the frequency of the saving operation can be reduced, and as a whole, it is possible to improve the writing performance of the flash memory.

The writing control of the present invention sometimes limits the parallelism degree, and the limitation of the parallelism degree causes the reduction of the writing speed. However, the invention is configured that the parallelism is limited only with the last blocks, and with the last blocks, too, the writing is carried out in parallel as far as possible. Even if the parallelism is limited as described above, therefore, its effect on the writing speed is very small.

The above description relates to the operations where the parallel writing to the flash memories is executed in the order, the flash memories 21→22→23→24→21→ . . . , however, the parallel writing is not limited to that order. That is, the respective flash memories are varied in hardware performance, and the time required for respective writings are not the same. Therefore, it is desirable that the data transfer is so controlled that data are written one after another in flash memories as these flash memories are ready for writing, instead of the parallel writing as described above.

In the above description, the "ready for writing" means as follows: if a specific data is being written into a specific sector of a specific block, the specific sector of the specific block is forbidden to write a next new data therein. The writing into this specific sector should be effective after the completion of writing the specific data into the specific sector. Therefore, the "ready for writing" means the status after the completion of writing the prior data.

As shown in FIGS. 2 (b), (c), if the size of data to be written is 32 kilobytes or 24 kilobytes, there is a period when the parallelism degree is limited to 2, that is, a period for parallel writing in two flash memories 21, 22. If, therefore, there exists an unerased region within the remaining flash memories 23, 24, it is desirable to carry out the erase operation of this region along with writing in the flash memories 21, 22.

In the above description, when the data for q/p−zm blocks are written, each data for y block is written on w+1 flash memories in parallel, and after that, each data for 1−y block is written on w flash memories in parallel. But the present invention is not limited to that. That is, as shown in 8 (a), the data for q/p−zm blocks may be written on w+1 flash memories in parallel.

But in this case, there is a possibility that the number of blocks having vacant regions will be two or more. Yet, needless to say, the number is smaller than the prior art.

Meanwhile, to read or rewrite data written in parallel as described above, the address management unit 42 has to control and manage the state of data writing in the flash memories 21, 22, 23, 24. That is, the address management unit 42 is so arranged as to generate a block management table (see FIG. 3) provided with the following fields for every logical address block to be accessed.

The expression parallelism degree field is a field to show on how many flash memories data are written in parallel. That is, in the parallelism degree field of a logical address block in which 4 blocks are written as mentioned above, "4" is set as shown in FIG. 3 (a). Meanwhile, in the parallelism degree field of the logical address block where two blocks are written and 1.5 blocks are written, "2" is set as shown in FIGS. 3 (b), (c). In the parallelism degree field for the logical address block where no blocks are written, "0" is set.

Next, the field for the number of non-parallelism sectors means a field showing, of 32 pieces of sectors contained in the logical address blocks, the number of sectors where parallelism writing is not carried out. That is, in the field for the number of non-parallelism sectors where four blocks and two blocks are written, "0" is set as shown in FIGS. 3 (a), (b). Meanwhile, in the field for the number of non-parallelism sectors field where 1.5 blocks are written, "16" is set as shown in FIG. 3 (c).

Next, the flash memory designated field is a field to indicate a flash memory where the address block exists. For example, in the flash memory designated field of the logical address block which is present within the flash memory 21, "0" is set, and in the flash memory designated field of the logical address block which is present within the flash memory 22, "1" is set. In the flash memory designated field of the logical address block which is present within the flash memory 23, "2" is set, and in the flash memory designated field of the logical address block which is present within the flash memory 24, "3" is set Next, the physical address field is a field indicating the physical address corresponding to the logical address block. Needless to say, the physical address set in that field is a physical address within the flash memory indicated in the flash memory designated field.

Next, the sector row control field is a field indicating the parallel writing order in sectors. For example, if parallel writing is done in this order: flash memories 21→22→23→24→21→ . . . , "0" as sector row control information corresponding to logical address a, "1" as sector row control information corresponding to logical address a+1, "2" as sector row control information corresponding to logical address a+2, "3" as sector row control information corresponding to logical address a+3 rank as shown in FIG. 3(a).

[Second Data Writing Control Method]

Meanwhile, data to be written on the flash memory are usually a series of image data or music data (one image film or one music file). Even when data written on the flash memory are erased, there is a possibility that a series of image data or music data (that is, data continuously written) will be erased by blocks. In the first data writing control, therefore, data are written in parallel in principle as far as possible so as not to reduce the writing speed.

However, rather than writing in parallel as far as possible as the first data writing control method, single writing sometimes improves performance of writing data in the flash memory in some cases if viewed as a whole.

Figure 7:
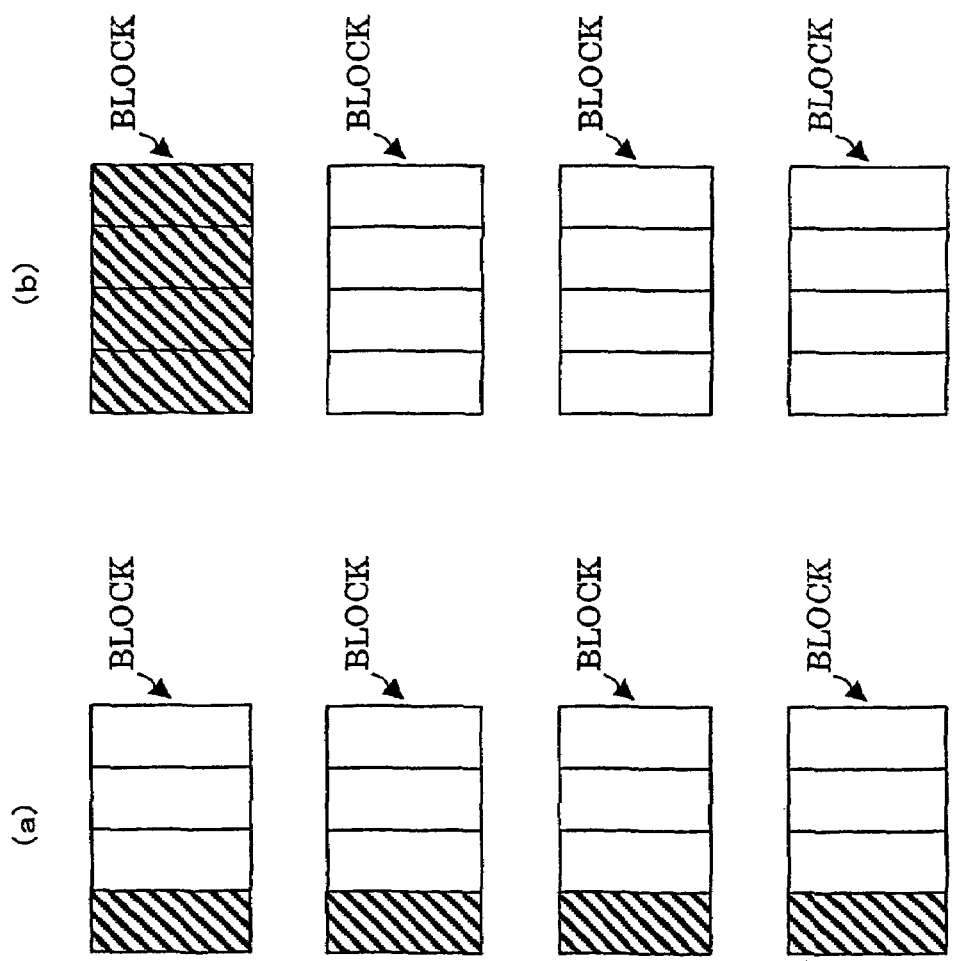
FIG. 7 is diagram of data rewriting.
Figure 8:
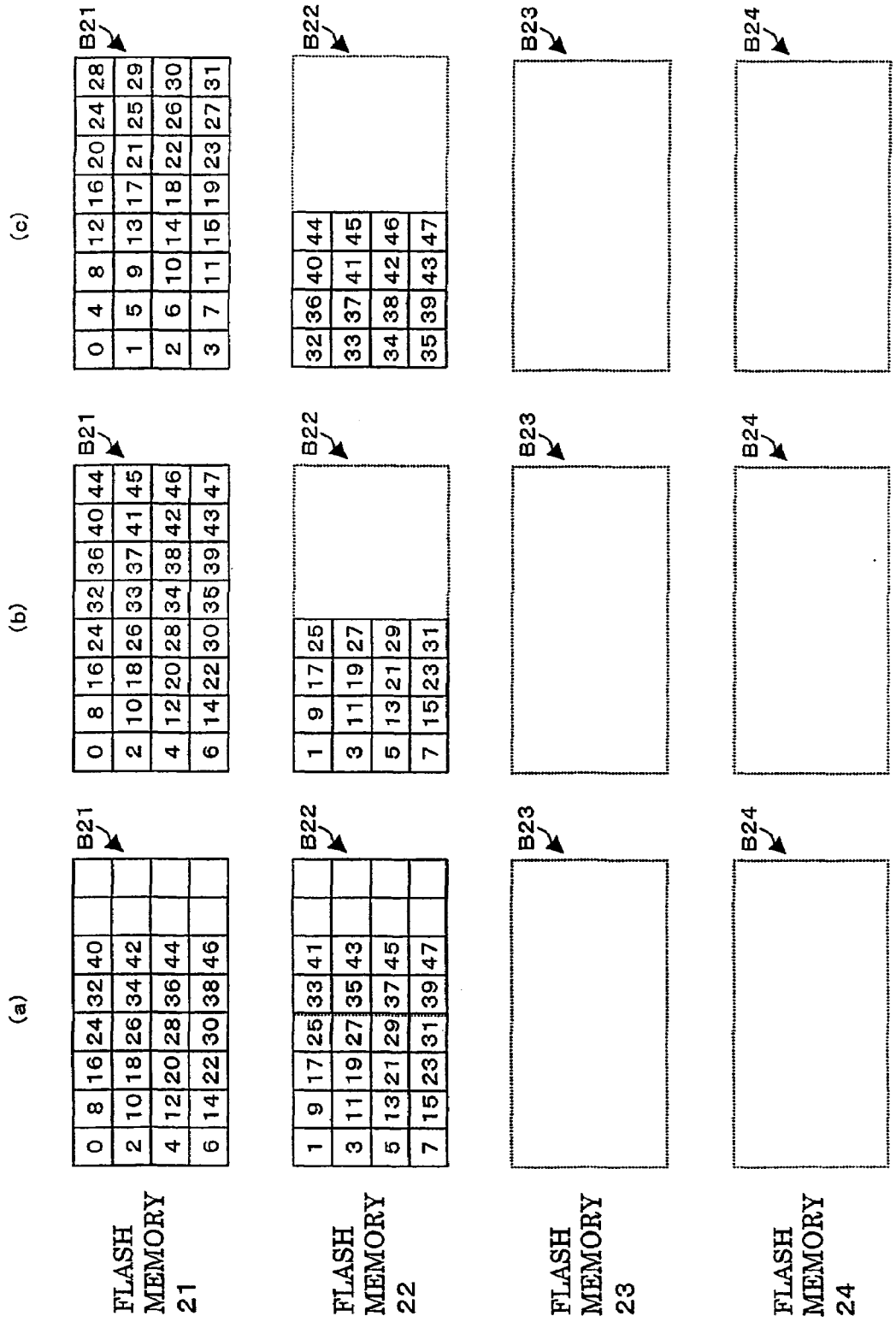
FIG. 8 is a diagram in which data for q/p−zm blocks are being rewritten.
Figure 9:
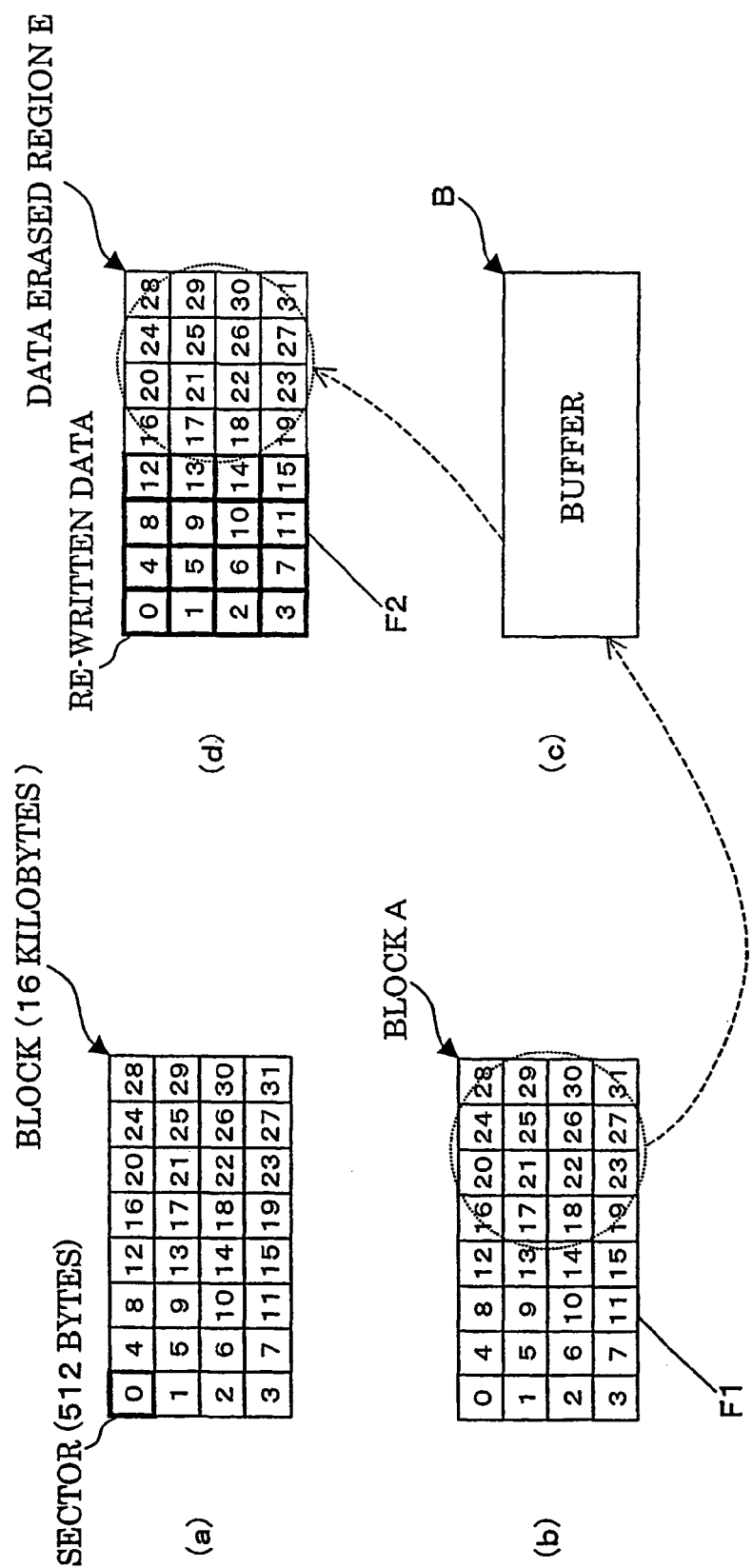
FIG. 9 is an explanatory diagram of a block, sector and the saving operation for the rewriting.
Figure 10:
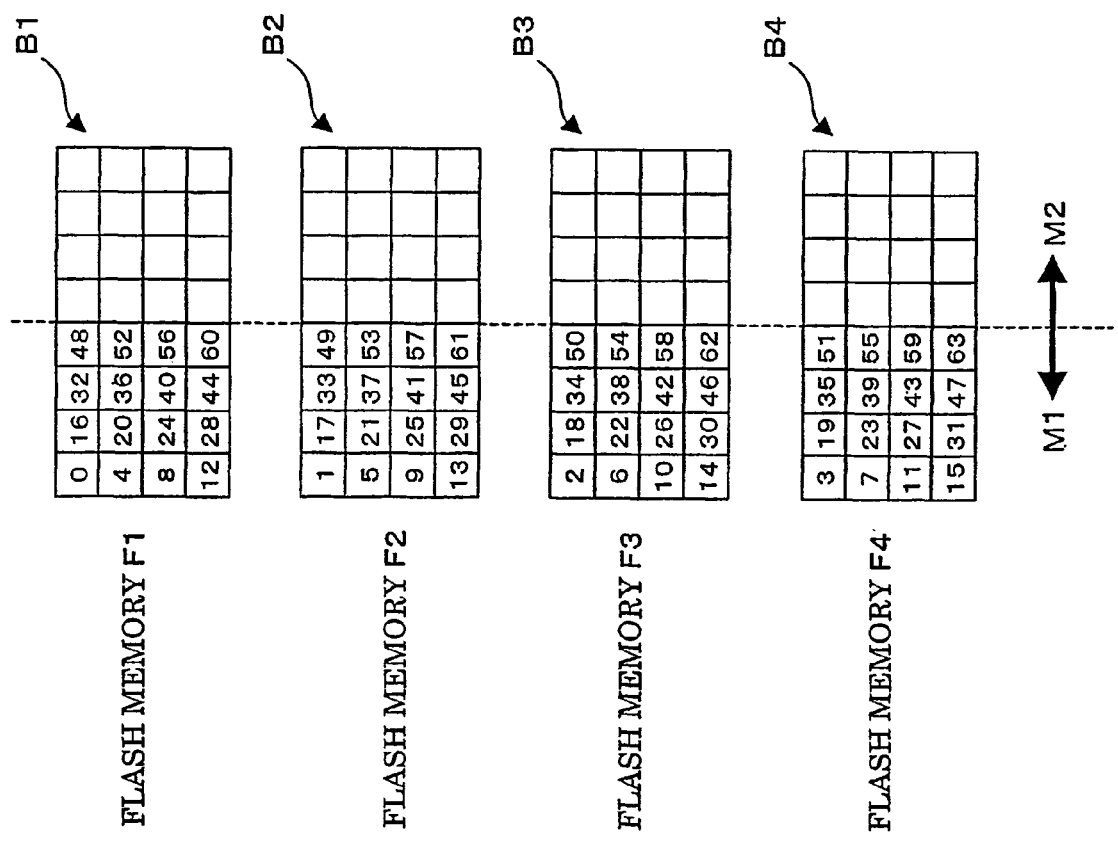
FIG. 10 is an explanatory diagram of blocks in which other data exist.

In editing work on music data written on the flash memory, for example, part of the continuously written data needs to be rewritten. In this case, it is better that the data, an object to be rewritten, is written on one block as hatched area as shown in FIG. 7 (b) rather than being written over a plurality of blocks shown as hatched regions. That is because in the case shown in FIG. 7 (a)(prior art), four blocks have to be saved, while in the case shown in FIG. 7 (b), one block has to be evaluated in rewriting.

For such a reason, if after continuous data are written in a plurality of flash memories in parallel by the first data writing control method, part of this continuous data should have to be written, it is preferable to adopt the following control method.

Receiving a request to write data, the address management unit 42 refers to the contents of the block control table and judges whether the request to write data is a request to rewrite part of the continuous data (hereinafter referred as "request to rewrite data") or a request to write newly continuous data (hereinafter referred to as "request to write new data." In other words, in the case of a request to write data in a logical address region where data have already been written, this request to write data is judged as request to rewrite data, while in the case of a request to write data in a logical address region where no data have been written yet, the request to write data is judged as a request to write new data.

And judging that the request to write data is a request to write new data, the address management unit 42 adopts the first data writing control method. On the other hand, the address management unit 42, which judges the request to write data as a request to rewrite data, further judges if there is data that does not have to be rewritten in the block to which the data, an object to write, belongs.

As shown in FIG. 4, for example, when data 0 to 47 are written in flash memories 21, 22 in the 1.5 block writing method and there is a request to rewrite data 32 to 47, there are data 0 to 31 (except for odd number) that do not have to be rewritten in the block to which data 32 to 47 belong. Therefore, in this case, the address management unit 42 judges that there are data that do not have to be rewritten, and exercises the following controls.

First, the address management unit 42 takes data for 1.5 block as data for q/p−zm blocks, the data for 1.5 block being the sum of data 0–31 (32 pieces of sector data) that do not have to be re-written and data 32 to 47 (16 pieces of sector data, the writing of which is requested. Here, needless to say, w is 1 and y is 0.5.

And the address management unit 42 controls the data transfer so that the data for q/p−zm blocks are allocated to w+1 flash memory 23, 24, and then the data is written on the respective flash memories 23, 24 in the predetermined order (in this case, 23→24). That is, the data transfer is so controlled that data 0–31 written in two blocks in parallel are first read out on the buffer 33 and written in an erased region of flash memory 23, while rewritten data 32 to 47 are written in the erased region of the flash memory 24. It is noted that the data 32 to 47 written in the flash memory 24 is a data given to the address management unit 42 from outside through input and output control unit 41, and buffer 34.

According to the second data writing control as mentioned above, each block on flash memories 23 and 24 stores continuous series of data as shown in FIG. 4(b). Under this arrangement, if necessary to rewrite data 0 to 31 or data 32 to 47 again, the saving operation will not occur.

There has been described the operation in case where the address management unit 42 judges that "there exist data that do not have to be rewritten." That is, no mention is made of the operation when the address management unit 42 judges that "there are no data that do not have to be re-written." In such a judgment, arrangements are so made that the address management unit 42 adopts the first data writing control method.

That is because that "there are not data that do not have to be rewritten" means that all data will be rewritten. For example, that there is a request to write data for two blocks in the 1.5 block region means that data for the previous 1.5 blocks is not needed. Therefore, it is reasonable that such a request to write data is considered to be a request to newly write continuous data.

Figure 5:
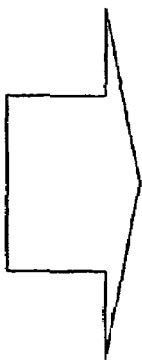
FIG. 5 is a block management table at the time of the second data writing control.

Finally, how the contents of the block control table undergoes changes by an example of the second data writing control is shown in FIG. 5. The arrangements of fields and setting information are the same as the first data writing control and will not be described.

The invention claimed is:

1. A storing device capable of writing data onto a plurality of installed storing mediums in parallel, wherein each storing medium is formed by a specific number of blocks, and each block contains a specific number of storing regions, and the data writing is executed for every storing region while data erasing is executed by blocks, the storing device comprising:
an address management unit operable to calculate a quotient by dividing q by p, which is expressed by $zm+w+y$ ($z$: $0 \leq z$ (integer); $w$: $0 \leq w < m$ (integer); $y$: $0 \leq y < 1$), and to control data transfer so as to write data for $zm$ blocks on $m$ storing mediums by writing $m$ blocks, 1 per medium, in parallel $z$ times, and then to write data for $q/p-zm$ blocks on $w+1$ storing mediums ($w$ in the case of $y=0$),
where $q$ is the size of all the data to be written from outside, $m$ is the number of the storing mediums, and $p$ is the size of the block.

2. The storing device of claim 1, wherein the address management unit controls the data transfer so that the data for $q/p-zm$ blocks are written on $w+1$ storing mediums in parallel.

3. The storing device of claim 1, wherein the address management unit controls the data transfer of the data for $q/p-zm$ blocks so that each data for y block is written on w+1 storing mediums in parallel and after that, each data for 1−y block is written on w storing mediums in parallel.

4. The storing device of claim 1, wherein the address management unit controls the data transfer so that the data for q/p−zm blocks are allocated to w+1 storing mediums and written in a specific order assigned to each storing medium.

5. The storing device of claim 4, wherein, when a block containing storing regions to write data therein has data not to be rewritten, the address management unit controls the data transfer so as to write the sum of the data not to be rewritten and the data requested to be written as the data for q/p−zm blocks.

6. The storing device of claim 1, wherein the address management unit controls the data transfer so as to write data one after another in storing mediums as said storing mediums are ready for writing.

7. The storing device of claim 1, wherein the address management unit controls the data transfer so as to write the data for q/p−zm blocks, as well as to erase data from blocks unerased in storing mediums which need not write data therein.

8. The storing device of claim 1, wherein the address management unit has a management table on which information can be set related to a logical address to be accessed, said information being at least one of the following kinds of information: storing medium designation information to specify a storing medium, physical address information to indicate a physical address of the storing medium where data are written, parallelism degree information to indicate the number of storing mediums to which data are written in parallel, non-parallelism storing region information to indicate the number of storing regions to which data are not written in parallel, and storing region row management information to indicate parallel writing order by storing region by storing region.

9. A storing control method for controlling a storing device capable of writing data onto a plurality of installed storing mediums in parallel, wherein each storing medium is formed by the specific number of blocks, and each block contains the specific number of storing regions, and the data writing is executed for every storing region while data erasing is executed by blocks, the control method comprising steps of:

calculating a quotient by dividing q by p, which is expressed by zm+w+y (z: $0 \leq z$ (integer); w: $0 \leq w < m$ (integer); y: $0 \leq y < 1$);

where q is the size of all the data to be written from outside, m is the number of the storing mediums, and p is the size of the block, and controlling data transfer so as to write data for zm blocks on m storing mediums by writing m blocks, 1 per medium, in parallel z times, and then to write data for q/p−zm blocks on w+1 storing mediums (w in the case of y=0).

10. A computer program product embodied on a computer readable storage medium for use with a computer for controlling a storing device provided with a plurality of storing medium so as to perform a storing control method for a storing device capable of writing data onto a plurality of installed storing mediums in parallel, wherein each storing medium is formed by the specific number of blocks, and each block contains the specific number of storing regions, and the data writing is executed for every storing region while data erasing is executed by blocks, the computer program product comprising:

a block number calculation program code operable to perform a calculation of a quotient by dividing q by p, which is expressed by zm+w+y (z: $0 \leq z$ (integer); w: $0 \leq w < m$ (integer); y: $0 \leq y < 1$);

where q is the size of all the data to be written from outside, m is the number of the storing mediums, and p is the size of the block, and a data transfer control program code operable to control data transfer so as to write data for zm blocks on m storing mediums by writing m blocks, 1 per medium, in parallel z times, and then to write data for q/p−zm blocks on w+1 storing mediums (w in the case of y=0).

11. The computer program product of claim 10, wherein the data transfer control program code is operable to write the data for q/p−zm blocks on w+1 storing mediums in parallel.

12. The computer program product of claim 10, wherein the data transfer control program code is operable to write the data for q/p−zm blocks so that each data for y block is written on w+1 storing mediums in parallel and after that, each data for 1−y block is written on w storing mediums in parallel.

13. The computer program product of claim 10, wherein the data transfer control program code is operable to allocate the data for q/p−zm blocks to w+1 storing mediums and write the data in a specific order assigned to each storing medium.

14. The computer program product of claim 10, wherein the data transfer control program code is operable to control the data, when a block contains storing regions to write data therein has data not to be rewritten, to write the sum of the data not to be rewritten and the data requested to be written as the data for p/q−zm blocks.

* * * * *

UNITED STATES PATENT AND TRADEMARK OFFICE
CERTIFICATE OF CORRECTION

PATENT NO. : 7,062,630 B2
APPLICATION NO. : 10/399236
DATED : June 13, 2006
INVENTOR(S) : Toshihiko Otake et al.

It is certified that error appears in the above-identified patent and that said Letters Patent is hereby corrected as shown below:

On the title page of the Letters Patent,

Item "(57) ABSTRACT", change "(win " to -- (w in --

Signed and Sealed this

Twentieth Day of February, 2007

JON W. DUDAS
*Director of the United States Patent and Trademark Office*